US010291237B2

(12) United States Patent
Huang et al.

(10) Patent No.: US 10,291,237 B2
(45) Date of Patent: May 14, 2019

(54) OSCILLATOR CIRCUIT WITH RECONFIGURABLE OSCILLATOR AMPLIFIER AND/OR HYBRID AMPLITUDE CALIBRATION CIRCUIT AND ASSOCIATED METHOD

(71) Applicant: MEDIATEK INC., Hsin-Chu (TW)

(72) Inventors: Hao-Wei Huang, Taoyuan (TW);
Yen-Tso Chen, Hsinchu (TW);
Song-Yu Yang, Chiayi (TW)

(73) Assignee: MEDIATEK INC., Hsin-Chu (TW)

( * ) Notice: Subject to any disclaimer, the term of this patent is extended or adjusted under 35 U.S.C. 154(b) by 221 days.

(21) Appl. No.: 15/355,073

(22) Filed: Nov. 18, 2016

(65) Prior Publication Data

US 2017/0294915 A1 Oct. 12, 2017

Related U.S. Application Data

(60) Provisional application No. 62/321,185, filed on Apr. 11, 2016.

(51) Int. Cl.
*H03B 5/06* (2006.01)
*H03B 5/12* (2006.01)
(Continued)

(52) U.S. Cl.
CPC .............. *H03L 5/00* (2013.01); *H03B 5/06* (2013.01); *H03B 5/1215* (2013.01); *H03B 5/1228* (2013.01); *H03B 5/1262* (2013.01); *H03B 5/1265* (2013.01); *H03B 5/24* (2013.01); *H03B 5/30* (2013.01); *H03B 5/32* (2013.01); *H03B 5/364* (2013.01); *H03L 3/00* (2013.01); *H03B 2200/009* (2013.01); *H03B 2200/0082* (2013.01); *H03B 2200/0094* (2013.01); *H03B 2201/0266* (2013.01)

(58) Field of Classification Search
CPC .......... H03B 5/32; H03B 5/30; H03B 5/1215; H03B 5/1265; H03B 5/1228; H03B 5/00; H03B 5/24; H03B 5/364; H03B 5/06; H03B 5/1262; H03L 3/00; H03L 5/00
USPC ....... 331/175, 116 R, 116 FE, 158, 182, 183
See application file for complete search history.

(56) References Cited

U.S. PATENT DOCUMENTS

| 4,956,618 A | 9/1990 | Ulmer |
| 6,025,757 A * | 2/2000 | Tsukagoshi .............. H03B 5/06 |
| | | 331/109 |

(Continued)

FOREIGN PATENT DOCUMENTS

| JP | 2000286637 A | 10/2000 |
| TW | 201115905 A1 | 5/2011 |

(Continued)

*Primary Examiner* — Arnold M Kinkead
(74) *Attorney, Agent, or Firm* — Winston Hsu

(57) ABSTRACT

An oscillator circuit has a reconfigurable oscillator amplifier. The reconfigurable oscillator amplifier is used to be coupled to a resonant circuit in parallel. The reconfigurable oscillator amplifier supports different circuit configurations for different operation modes, respectively. The reconfigurable oscillator amplifier has at least one circuit component shared by the different circuit configurations. The reconfigurable oscillator amplifier employs one of the different circuit configurations under one of the different operation modes.

17 Claims, 11 Drawing Sheets

(51) Int. Cl.
    *H03B 5/24*     (2006.01)
    *H03B 5/30*     (2006.01)
    *H03B 5/32*     (2006.01)
    *H03B 5/36*     (2006.01)
    *H03L 3/00*     (2006.01)
    *H03L 5/00*     (2006.01)

(56) References Cited

U.S. PATENT DOCUMENTS

| | | |
|---|---|---|
| 7,123,113 B1 | 10/2006 | Brennan |
| 8,816,786 B2 | 8/2014 | Tham |
| 2008/0143452 A1* | 6/2008 | Rosik .................. H03B 5/06 331/158 |
| 2010/0188156 A1 | 7/2010 | Arai |
| 2010/0188157 A1 | 7/2010 | Kondo |
| 2010/0206074 A1 | 8/2010 | Yoshida |
| 2011/0037527 A1* | 2/2011 | Shrivastava ........ H03B 5/06 331/158 |
| 2011/0148535 A1 | 6/2011 | Lee |
| 2011/0241791 A1 | 10/2011 | Hung |
| 2011/0304407 A1 | 12/2011 | Chiang |
| 2012/0081155 A1 | 4/2012 | Li |
| 2012/0098609 A1 | 4/2012 | Verma |
| 2013/0141171 A1 | 6/2013 | Huang |
| 2013/0222070 A1 | 8/2013 | Liscidini |
| 2014/0210565 A1 | 7/2014 | Vilas Boas |
| 2015/0130514 A1 | 5/2015 | Lee |

FOREIGN PATENT DOCUMENTS

| | | |
|---|---|---|
| WO | 2006129405 A1 | 12/2006 |
| WO | 2015138105 A1 | 9/2015 |

\* cited by examiner

OSCILLATOR CIRCUIT WITH RECONFIGURABLE OSCILLATOR AMPLIFIER AND/OR HYBRID AMPLITUDE CALIBRATION CIRCUIT AND ASSOCIATED METHOD

CROSS REFERENCE TO RELATED APPLICATIONS

This application claims the benefit of U.S. provisional application No. 62/321,185, filed on Apr. 11, 2016 and incorporated herein by reference.

BACKGROUND

The present invention relates to a clock source design, and more particularly, to an oscillator circuit with a reconfigurable oscillator amplifier and/or a hybrid amplitude calibration circuit and an associated method.

A reference clock is generally required in a variety of circuits. For example, a clock source may be realized by a crystal oscillator for providing a required reference clock, where a quartz crystal resonator used in the crystal oscillator operates like a resonant circuit that is tuned to a selected resonant frequency. In order to initiate and maintain strain on the quartz crystal resonator, the crystal oscillator includes an oscillator amplifier coupled across nodes of the crystal. The crystal oscillator may be required to operate under different modes to generate the reference clock for different system scenarios. In addition, amplitude calibration may be required to control the oscillation amplitude for achieving good noise performance of the crystal oscillator output when there is a mode transition from a current operation mode to a next operation mode. Thus, there is a need for an innovative oscillator amplifier design capable of supporting different operation modes and/or an innovative amplitude calibration design with quick settling, low power and high performance.

SUMMARY

One of the objectives of the claimed invention is to provide an oscillator circuit with a reconfigurable oscillator amplifier and/or a hybrid amplitude calibration circuit and an associated method.

According to a first aspect of the present invention, an exemplary oscillator circuit is disclosed. The exemplary oscillator circuit includes a reconfigurable oscillator amplifier configured to be coupled to a resonant circuit in parallel. The reconfigurable oscillator amplifier supports different circuit configurations for different operation modes, respectively. The reconfigurable oscillator amplifier comprises at least one circuit component shared by the different circuit configurations. The reconfigurable oscillator amplifier is configured to employ one of the different circuit configurations under one of the different operation modes.

According to a second aspect of the present invention, an exemplary method for configuring an oscillator amplifier coupled to a resonant circuit in parallel is disclosed. The exemplary method includes: when the oscillator amplifier is required to enter a first operation mode, configuring the oscillator amplifier to employ a first circuit configuration; and when the oscillator amplifier is required to enter a second operation mode different from the first operation mode, configuring the oscillator amplifier to employ a second circuit configuration different from the first circuit configuration, wherein at least one circuit component used in the first operation mode is reused in the second operation mode.

According to a third aspect of the present invention, an exemplary oscillator circuit is disclosed. The exemplary oscillator circuit includes an oscillator amplifier and a hybrid amplitude calibration circuit. The oscillator amplifier is configured to be coupled to a resonant circuit in parallel. The hybrid amplitude calibration circuit is configured to perform amplitude calibration upon an oscillation signal generated from the resonant circuit to determine a final bias setting of the oscillator amplifier during a mode transition from a first operation mode of the oscillator amplifier to a second operation mode of the oscillator amplifier, wherein the hybrid amplitude calibration circuit determines the final bias setting by using different amplitude calibration schemes.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
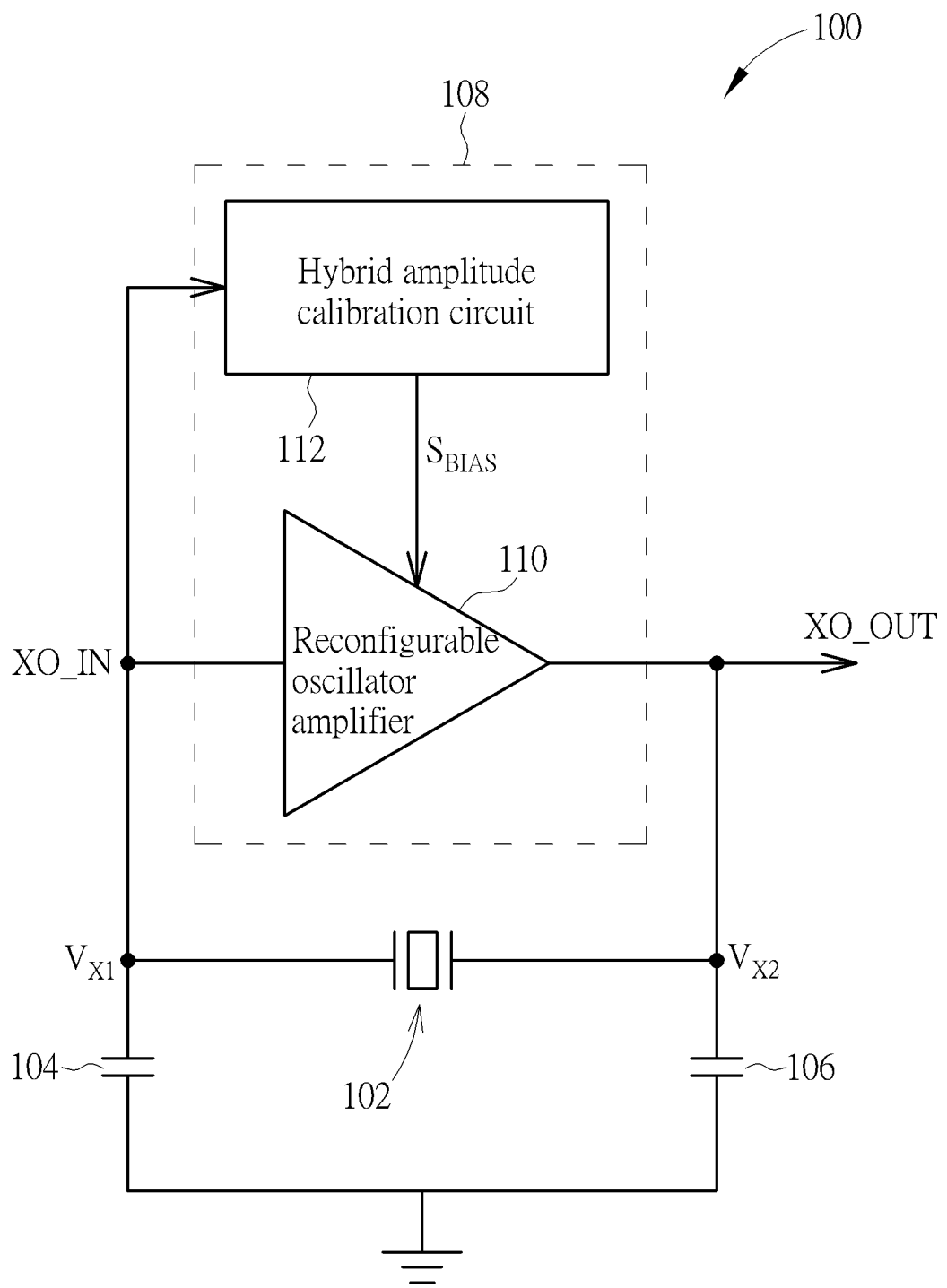
FIG. 1 is a diagram illustrating a clock source according to an embodiment of the present invention.

FIG. 1 is a diagram illustrating a clock source according to an embodiment of the present invention. For example, the clock source 100 may be a crystal oscillator including a resonant circuit (e.g., a quartz crystal resonator) 102, a plurality of capacitors 104, 106, and an oscillator circuit 108. In this embodiment, the oscillator circuit 108 includes a reconfigurable oscillator amplifier 110 and a hybrid amplitude calibration circuit 112. The capacitors 104 and 106 are coupled to nodes $V_{X1}$ and $V_{X2}$ of the oscillator circuit 108, respectively. The reconfigurable oscillator amplifier 110 is coupled to the resonant circuit 102 in parallel. That is, the reconfigurable oscillator amplifier 110 is coupled across nodes $V_{X1}$ and $V_{X2}$ of the resonant circuit 102. The reconfigurable oscillator amplifier 110 is operative to initiate and maintain strain on the resonant circuit 102, such that oscillation signals XO_IN and XO_OUT with desired frequency and controlled amplitude are generated from nodes $V_{X1}$ and $V_{X2}$ of the resonant circuit 102, respectively. In this embodiment, the reconfigurable oscillator amplifier 110 supports different circuit configurations for different operation modes, respectively. In addition, the reconfigurable oscillator amplifier 110 has at least one circuit component (e.g., active device(s) and/or passive device(s)) shared by the different circuit configurations. Since an oscillator amplifier with hardware sharing can reduce the number of circuit components needed for realizing different circuit configurations, the reconfigurable oscillator amplifier 110 can be implemented using a smaller die area, thus reducing the production cost.

Figure 2:
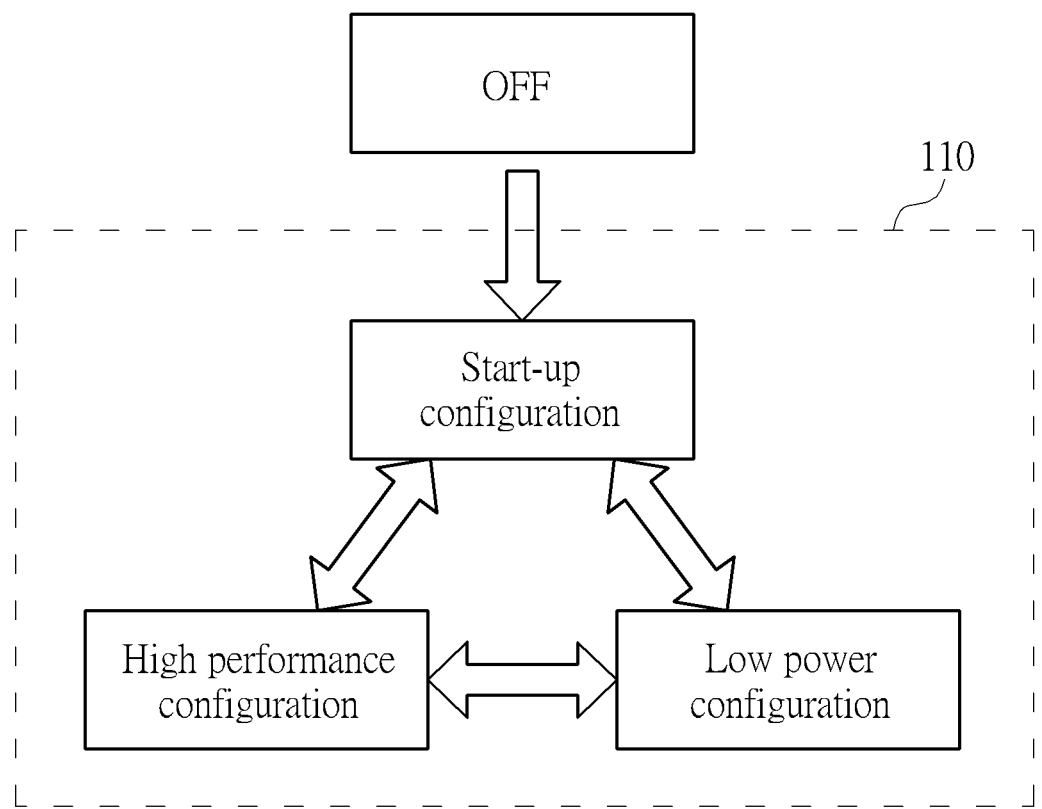
FIG. 2 is a diagram illustrating different circuit configurations supported by the reconfigurable oscillator amplifier shown in FIG. 1.

FIG. 2 is a diagram illustrating different circuit configurations supported by the reconfigurable oscillator amplifier 110 shown in FIG. 1. By way of example, but not limitation, the different circuit configurations supported by the reconfigurable oscillator amplifier 110 may include at least a start-up configuration (which is designed for a start-up mode), a high performance configuration (which is designed for a high performance mode), and a low power configuration (which is designed for a low power mode). The reconfigurable oscillator amplifier 110 is configured to employ one of different circuit configurations under one of different operation modes. For example, when the reconfigurable oscillator amplifier 110 is required to enter the start-up mode, the reconfigurable oscillator amplifier 110 is configured to employ the start-up configuration; when the reconfigurable oscillator amplifier 110 is required to enter the low power mode, the reconfigurable oscillator amplifier 110 is configured to employ the low power configuration; and when the reconfigurable oscillator amplifier 110 is required to enter the high performance mode, the reconfigurable oscillator amplifier 110 is configured to employ the high performance configuration. When a mode transition from a current operation mode to a next operation mode occurs, the reconfigurable oscillator amplifier 110 is configured to switch from a current circuit configuration to a different circuit configuration. As shown in FIG. 2, the reconfigurable oscillator amplifier 110 may switch between the start-up configuration and the high performance configuration, may switch between the start-up configuration and the low power configuration, and may switch between the high performance configuration and the low power configuration. It should be noted that, when there is a need to have a mode transition from a high performance mode to a low power mode, the reconfigurable oscillator amplifier 110 may be first configured to have the start-up configuration and then configured to have the low power configuration; and when there is a need to have a mode transition from a low power mode to a high performance mode, the reconfigurable oscillator amplifier 110 may be first configured to have the start-up configuration and then configured to have the high performance configuration.

The clock source 100 may be used by an electronic device. When the electronic device is powered on, the reconfigurable oscillator amplifier 110 is required to initially enter the start-up mode for enforcing the resonant circuit 102 to start oscillating. In one embodiment, the reconfigurable oscillator amplifier 110 with the start-up configuration has large transconductance (Gm) to provide larger driving current to the resonant circuit 102, thereby speeding up the start-up process. When the electronic device enters a normal/active mode, the reconfigurable oscillator amplifier 110 may be required to enter the high performance mode. In one embodiment, the reconfigurable oscillator amplifier 110 with the high performance configuration has larger fundamental voltage with few harmonic contents to achieve improved noise performance (e.g., low closed-in and far-out phase noise). When the electronic device enters a suspend/standby mode, the reconfigurable oscillator amplifier 110 may be required to enter the low power mode to save power. In one embodiment, the reconfigurable oscillator amplifier 110 with the low power configuration provides small driving current that is capable of sustaining the oscillation of the resonant circuit 102.

Figure 3:
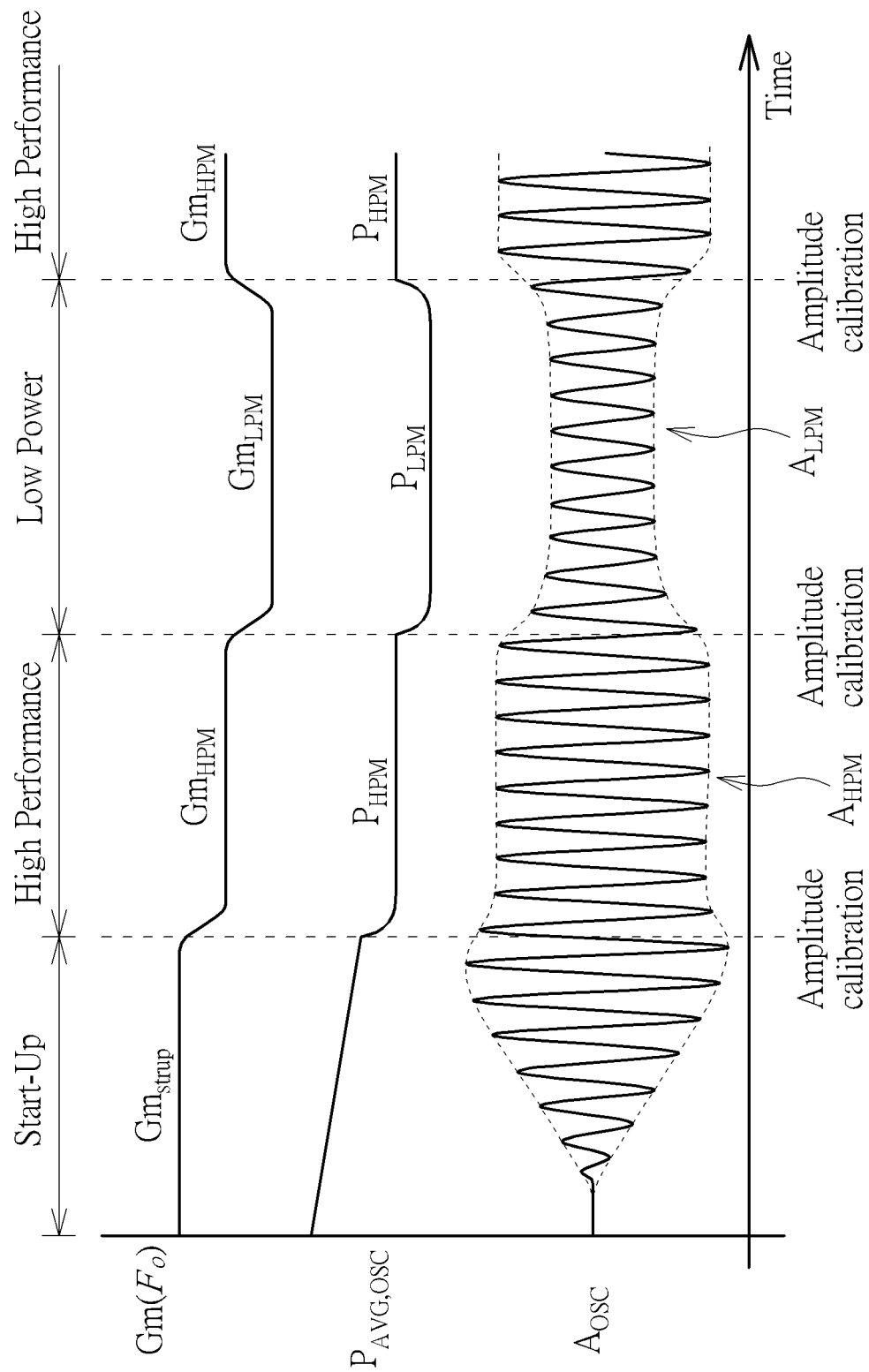
FIG. 3 is a diagram illustrating characteristics of a start-up configuration, a low power configuration and a high performance configuration according to an embodiment of the present invention.

FIG. 3 is a diagram illustrating characteristics of the start-up configuration, the low power configuration and the high performance configuration according to an embodiment of the present invention. With regard to the transconductance Gm at the target oscillation frequency $F_0$, the transconductance $Gm_{strup}$ of the start-up configuration is larger than the transconductance $Gm_{HPM}$ of the high performance configuration, and the transconductance $Gm_{HPM}$ of the high performance configuration is larger than the transconductance $Gm_{LPM}$ of the low power configuration. With regard to the average power consumption $P_{AVG,OSC}$ of the crystal oscillator, the average power consumption $P_{HPM}$ under the high performance mode in which the high performance configuration is operated is larger than the average power consumption $P_{LPM}$ under the low power mode in which the low power configuration is operated. In addition, the average power consumption under the start-up mode in which the start-up configuration is operated has a maximum value at the time the resonant circuit 102 starts oscillating. With regard to amplitude $A_{OSC}$ of the oscillation signals XO_IN and XO_OUT generated by the resonant circuit 102, the amplitude $A_{HPM}$ of the oscillation signals XO_IN and XO_OUT generated under a condition that the reconfigurable oscillator amplifier 110 has the high performance configuration is larger than the amplitude $A_{LPM}$ of the oscillation signals XO_IN and XO_OUT generated under a condition that the reconfigurable oscillator amplifier 110 has the low power configuration.

As shown in FIG. 3, amplitude calibration may be performed during a mode transition (e.g., a mode transition from a current operation mode to a next operation mode such as a high performance mode or a low power mode) to optimize the oscillator power and performance such as phase noise and frequency error. More specifically, with the amplitude calibration performed during the mode transition, an oscillator amplifier circuit configuration used in the next operation mode can be more robust. In this embodiment, the hybrid amplitude calibration circuit 112 is configured to perform the amplitude calibration upon the oscillation signal XO_IN generated from the resonant circuit 102 to determine a final bias setting $S_{BIAS}$ (e.g., bias current or bias voltage) of the reconfigurable oscillator amplifier 110 during a mode transition from a first operation mode to a second operation mode (e.g., high performance mode or low power mode). In this embodiment, the hybrid amplitude calibration circuit 112 determines the final bias setting $S_{BIAS}$ by jointly using different amplitude calibration schemes such as continuous-time amplitude calibration and discrete-time amplitude calibration. In this way, the hybrid amplitude calibration circuit 112 can gain benefits from both of the continuous-time amplitude calibration and the discrete-time amplitude calibration. For example, compared to typical discrete-time amplitude calibration which requires multiple times of lengthy oscillator settling, the continuous-time amplitude calibration which requires single oscillation settling has shorter calibration time. For another example, compared to the continuous-time amplitude calibration which suffers from noise and/or power consumption to keep the closed loop, the proposed discrete-time amplitude calibration can be properly designed to have lower power consumption and better noise performance.

Further implementation details of the oscillator circuit 108, including the proposed reconfigurable oscillator amplifier 110 and the proposed hybrid amplitude calibration circuit 112, are described as below.

Figure 4:
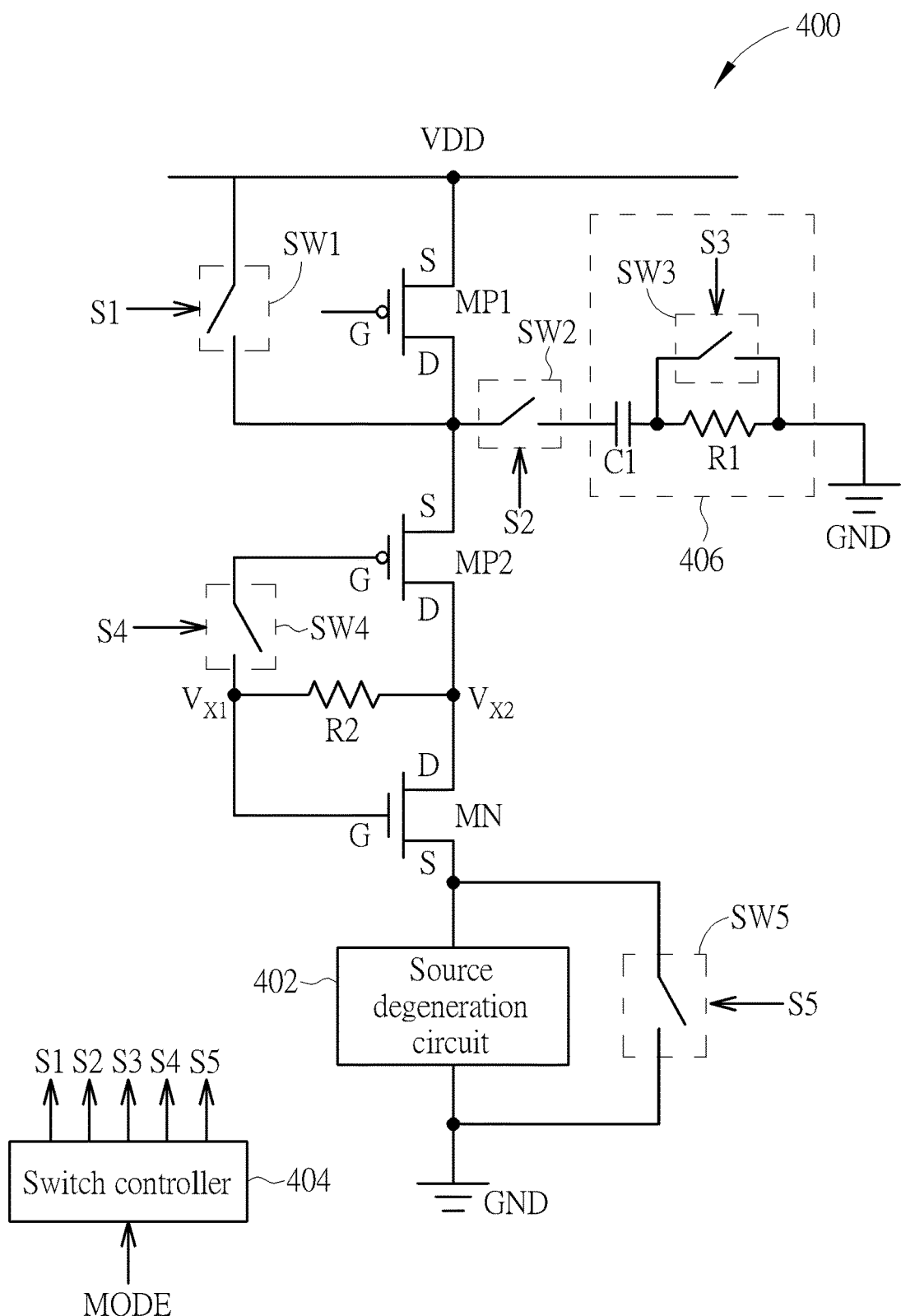
FIG. 4 is a diagram illustrating a reconfigurable oscillator amplifier according to an embodiment of the present invention.

FIG. 4 is a diagram illustrating a reconfigurable oscillator amplifier according to an embodiment of the present invention. For example, the reconfigurable oscillator amplifier 100 shown in FIG. 1 may be implemented using the reconfigurable oscillator amplifier 400 shown in FIG. 4. In this embodiment, the reconfigurable oscillator amplifier 400 includes a plurality of transistors MP1, MP2, MN, a plurality of switches SW1, SW2, SW3, SW4, SW5, a source degeneration circuit 402, a switch controller 404, a plurality of resistors R1, R2, and a capacitor C1, where the switch S3, the resistor R1 and capacitor C1 form one reconfigurable resistor-capacitor (RC) circuit 406. As shown in FIG. 4, each of the transistors MP1 and MP2 is a P-channel metal-oxide semiconductor (PMOS) transistor having a first connection node (e.g., source S), a second connection node (e.g., drain D), and a control node (e.g., gate G), and the transistor MN is an N-channel metal-oxide semiconductor (NMOS) transistor having a first connection node (e.g., drain D), a second connection node (e.g., source S), and a control node (e.g., gate G).

With regard to the transistor MP1, the first connection node is coupled to a first reference voltage (e.g., supply voltage VDD), and the second connection node is coupled to the first connection node of the transistor MP2. In addition, the second connection node of the transistor MP1 is selectively coupled to the first reference voltage VDD via the switch SW1, and selectively coupled to the reconfigurable RC circuit 406 via the switch SW2. With regard to the transistor MP2, the first connection node is coupled to the second connection node of the transistor MP1, the second connection node is connected to one node VX2 of the resonant circuit 102, and the control node is selectively coupled to another node VX1 of the resonant circuit 102 via the switch SW4. With regard to the transistor MN, the first connection node is coupled to one node VX2 of the resonant circuit 102, the control node is coupled to another node VX1 of the resonant circuit 102, and the second connection node is coupled to the source degeneration circuit 402 and selectively coupled to a second reference voltage (e.g., a ground voltage GND) via the switch SW5. As shown in FIG. 4, the resistor R2 is coupled between nodes $V_{X1}$ and $V_{X2}$ of the resonant circuit 102. The resistor R2 can serve as a self-bias circuit for both transistors MN and MP2 if the switch SW4 is switched on, and can serve as a self-bias circuit for the transistor MN if the switch SW4 is switched off. With regard to the reconfigurable RC circuit 406, the capacitor C1 is coupled to the resistor R1 in series, and the switch SW3 is coupled to the resistor R1 in parallel.

The on/off status of the switch SW1 decides whether the transistor MP1 is bypassed. The on/off status of the switch SW2 decides whether the reconfigurable RC circuit 406 is connected to the transistors MP1 and MP2. The on/off status of the switch SW3 decides whether the resistor R1 is bypassed. The on/off status of the switch SW4 decides whether the control node of the transistor MP2 is self-biased through the resistor R2. The on/off status of the switch SW5 decides whether the source degeneration circuit 402 is bypassed. With proper settings of switches SW1-SW5, the reconfigurable oscillator amplifier 400 can be configured to employ one of the start-up configuration, the high performance configuration and the low power configuration. In this embodiment, the switch controller 404 is used to generate switch control signals S1, S2, S3, S4, S5 according to the operation mode MODE, where the on/off statuses of switches SW1-SW5 are controlled by the switch control signals S1-S5, respectively. For example, when a switch control signal is set by a first logic level (e.g., "1"), an associated switch is switched on; and when the switch control signal is set by a second logic level (e.g., "0"), the associated switch is switched off.

Figure 5:
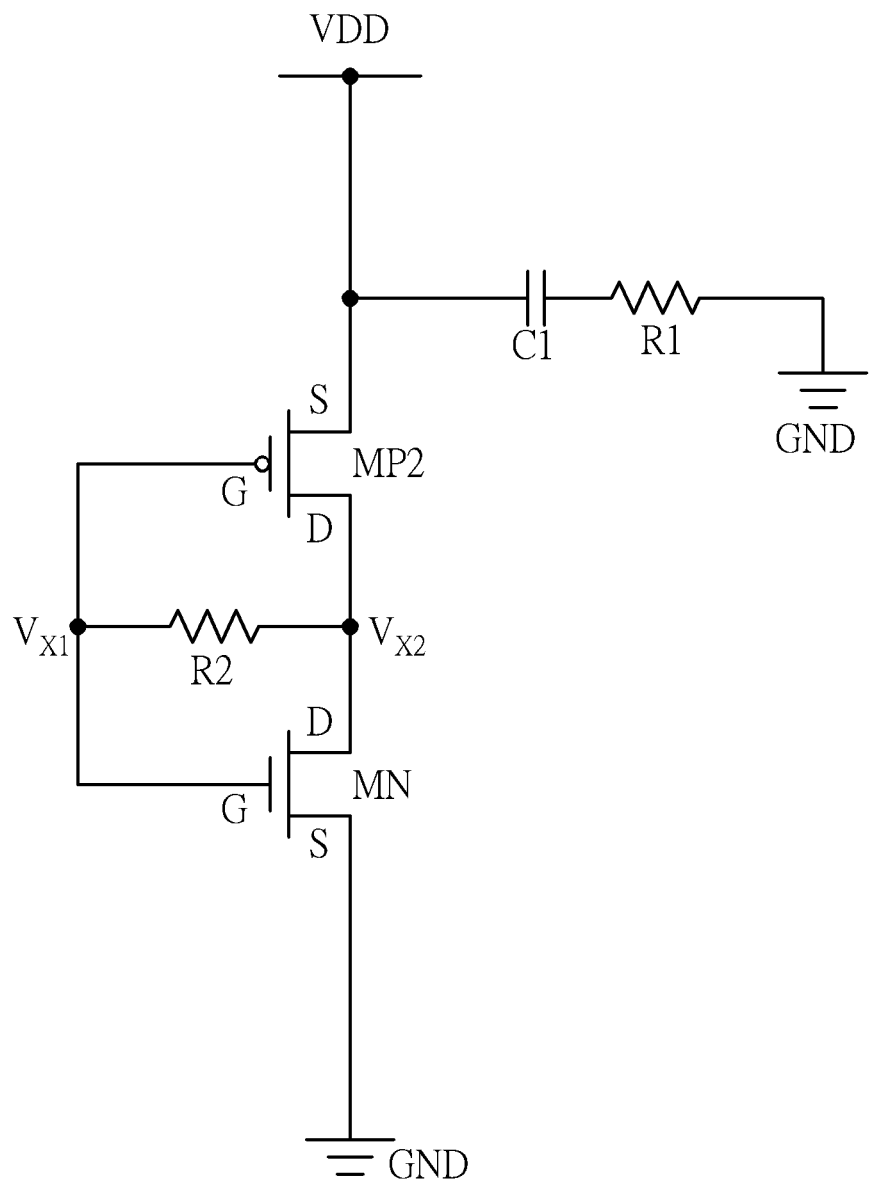
FIG. 5 is a diagram illustrating an equivalent circuit of the reconfigurable oscillator amplifier under the start-up mode according to an embodiment of the present invention.

When the operation mode MODE is the start-up mode, the switch controller 404 may set the switch control signals S1-S5 by "1", "1", "0", "1" and "1", respectively. FIG. 5 is a diagram illustrating an equivalent circuit of the reconfigurable oscillator amplifier 400 under the start-up mode according to an embodiment of the present invention. The negative Gm, self-biased transistors MP2 and MN are directly supplied with the first reference voltage VDD. Hence, a large loop gain of the start-up configuration can speed up the start-up process. For example, the practical start-up time may be 300 us. In a normal condition, the start-up process is ended when the amplitude of the oscillation signal XO_IN reaches a predetermined level. However, it is possible that the amplitude of the oscillation signal XO_IN fails to reach the predetermined level in an acceptable time period. Hence, a time out protection mechanism may be implemented to terminate the start-up process automatically. In this embodiment, the series-connected capacitor C1 and resistor R1 can be configured to have a large RC delay to provide the time out protection. Hence, the start-up process is automatically terminated when the large RC delay expires.

Figure 6:
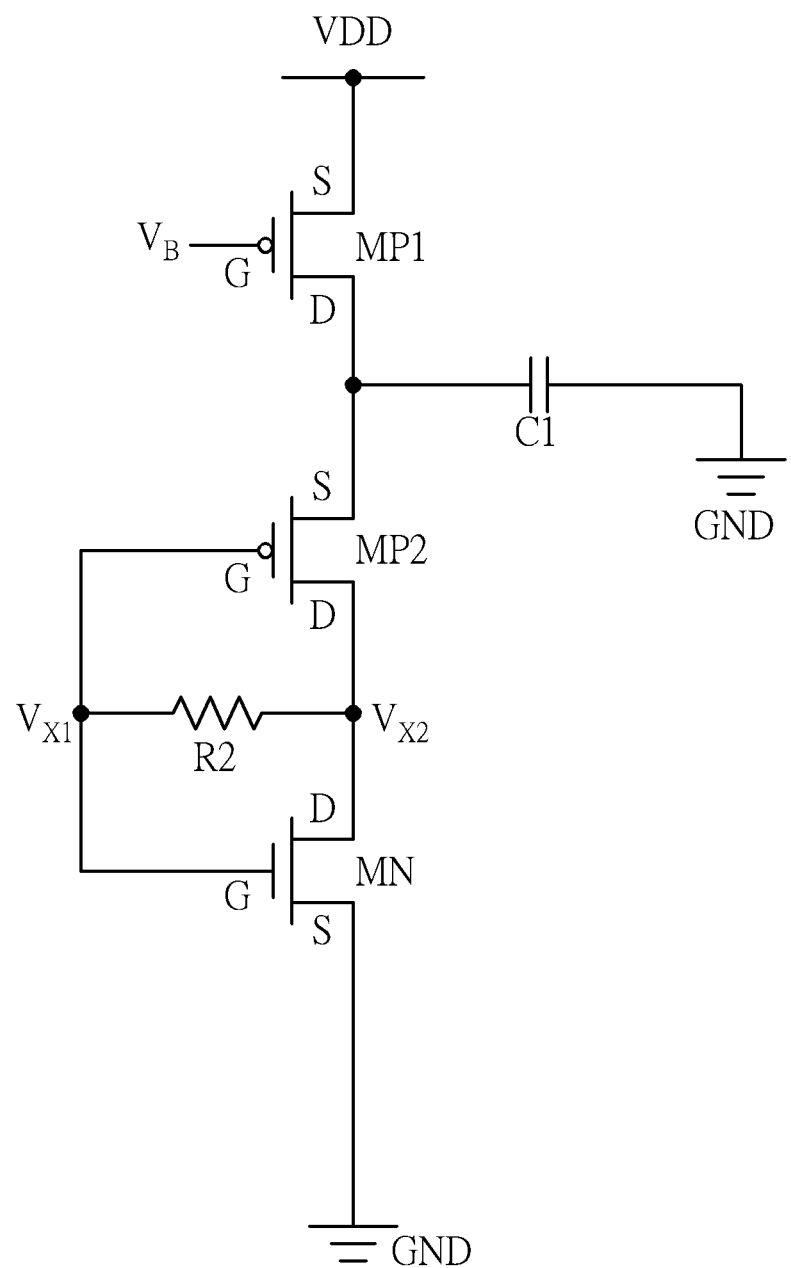
FIG. 6 is a diagram illustrating an equivalent circuit of the reconfigurable oscillator amplifier under the low power mode according to an embodiment of the present invention.

When the operation mode MODE is the low power mode, the switch controller 404 may set the switch control signals S1-S5 by "0", "1", "1", "1" and "1", respectively. FIG. 6 is a diagram illustrating an equivalent circuit of the reconfigurable oscillator amplifier 400 under the low power mode according to an embodiment of the present invention. A bias setting $V_B$ is applied to the control node of the transistor MP1, such that the transistor MP1 is biased to act as a current source. The transistors MP2 and MN are used to provide the negative Gm, and are supplied with current provided by the controlled current source (i.e., biased transistor MP1). The bias setting $V_B$ makes the transistor MP1 have a minimized current output that is still capable of allowing the resonant circuit 102 to sustain its oscillation. In this way, the power consumption can be effectively reduced to meet the low power requirement. In this embodiment, the capacitor C1 of the reconfigurable RC circuit 406 is reused as an alternating current (AC) low impedance path. The AC low impedance path prevents the controlled current source (i.e., biased transistor MP1) from degenerating the transistor MP2, thereby avoiding Gm degradation. In accordance with the low power configuration, the practical average current may be 15 uA, ¹⁄₄₀ smaller than high performance mode, and the practical amplitude of the oscillation signal XO_IN may be 600 mV or even smaller trade-offs between power and robustness over variation of environment.

Figure 7:
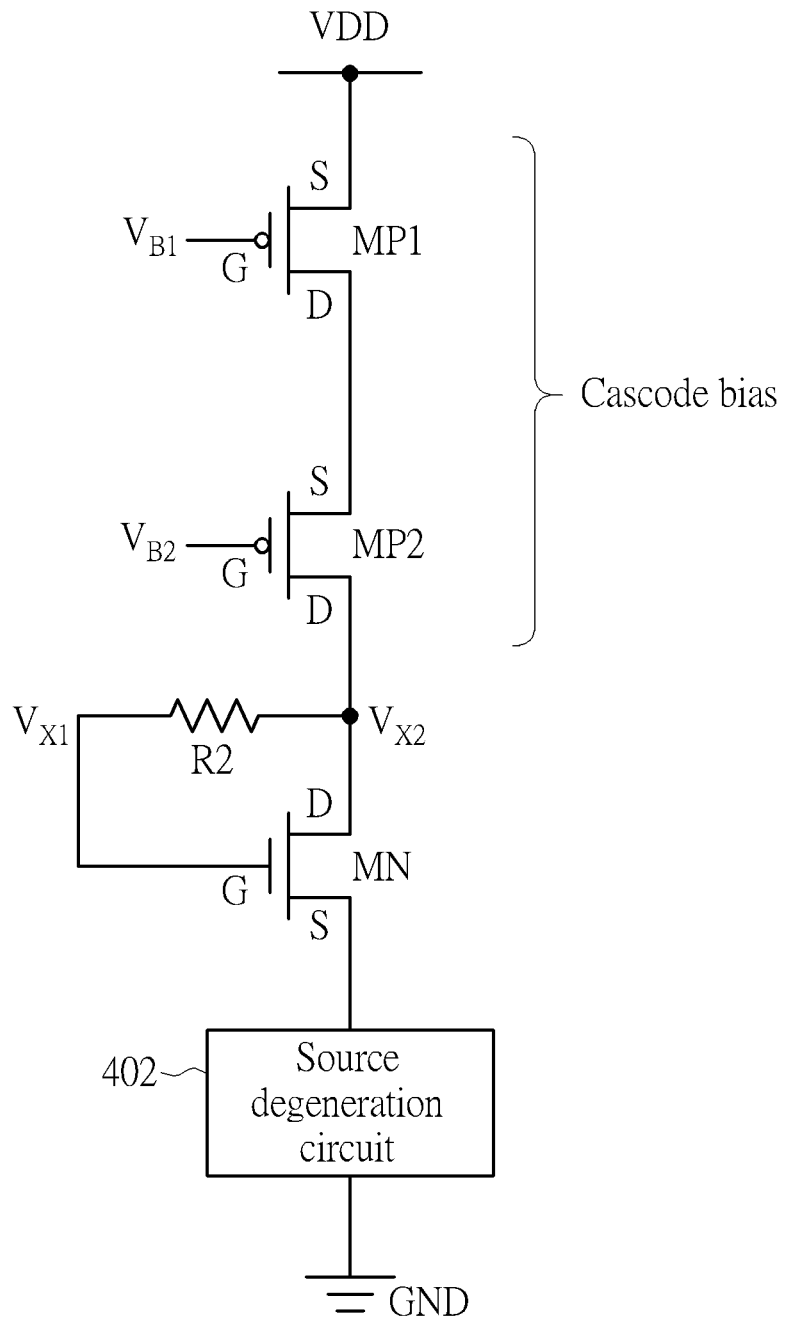
FIG. 7 is a diagram illustrating an equivalent circuit of the reconfigurable oscillator amplifier under the high performance mode according to an embodiment of the present invention.

When the operation mode MODE is the high performance mode, the switch controller 404 may set the switch control signals S1-S2 and S4-S5 by "0", "0", "0" and "0", respectively. FIG. 7 is a diagram illustrating an equivalent circuit of the reconfigurable oscillator amplifier 400 under the high performance mode according to an embodiment of the present invention. Only the transistor MN is used to provide the negative Gm, which allows the maximum amplitude of the oscillation signal XO_IN. The transistors MP1 and MP2 are cascoded to act as a current source. A bias setting is composed of $V_{B1}$ and $V_{B2}$, where $V_{B1}$ is applied to the control node of the transistor MP1, and $V_{B2}$ is applied to the control node of the transistor MP2. Compared to the current source implemented using the transistor MP1 only, the current source implemented using cascoded transistors MP1 and MP2 can have enhanced tank impedance as well as improved power supply rejection ratio (PSRR) for higher performance. In addition, the source degeneration circuit 402 is added to achieve better closed-in phase noise performance, reduced negative resistance (NR) variation and enhanced tank impedance during larger oscillation amplitude. For example, the practical phase noise may be below −50 dBc/Hz and −155 dBc/Hz at offset carrier frequencies 1 Hz and 100 KHz, respectively.

It should be noted that the circuit design shown in FIG. 4 is only one example of the reconfigurable oscillator amplifier, and is not meant to be a limitation of the present invention. For example, at least one of the source degeneration circuit 402, the RC circuit 406 and the resistor R2 (which acts as a self-bias circuit) may be omitted, depending upon actual design considerations.

Figure 8:
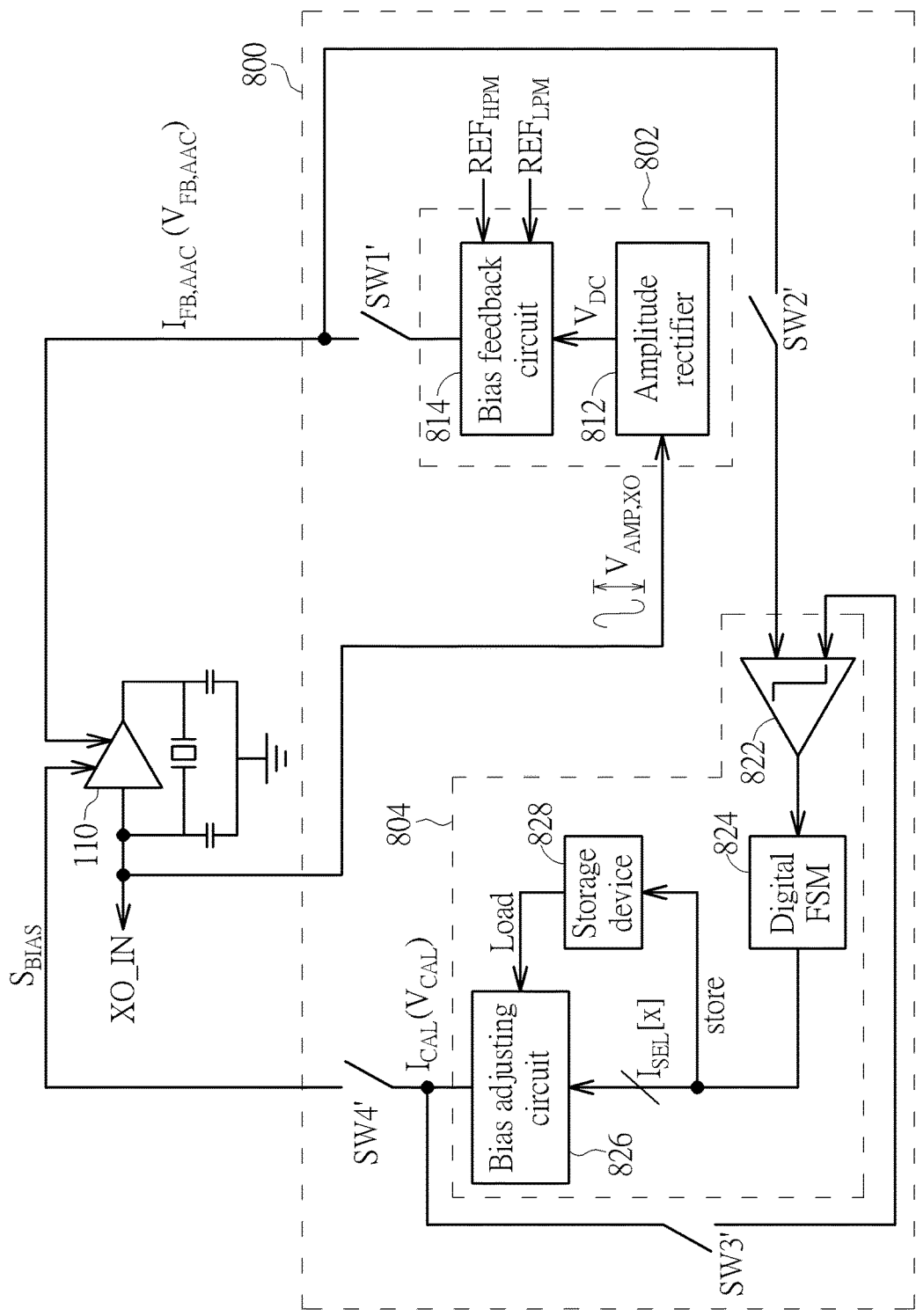
FIG. 8 is a diagram illustrating a hybrid amplitude calibration circuit according to an embodiment of the present invention.

As mentioned above, oscillation amplitude calibration can be performed during a mode transition from a current operation mode to a next operation mode to keep good noise performance in the next operation mode. FIG. 8 is a diagram illustrating a hybrid amplitude calibration circuit according to an embodiment of the present invention. For example, the hybrid amplitude calibration circuit 112 shown in FIG. 1 may be implemented using the hybrid amplitude calibration circuit 800 shown in FIG. 8. In this embodiment, the hybrid amplitude calibration circuit 800 determines the final bias setting $S_{BIAS}$ for an operation mode (e.g., high performance mode or low power mode) by jointly using continuous-time amplitude calibration and discrete-time amplitude calibration. The bias setting $V_B$ needed by the low power configuration shown in FIG. 6 or the bias setting ($V_{B1}$, $V_{B2}$) needed by the high performance configuration shown in FIG. 7 may be set by the final bias setting $S_{BIAS}$ directly or indirectly. For example, when the final bias setting $S_{BIAS}$ is a bias current setting, the bias setting $V_B$ or ($V_{B1}$, $V_{B2}$) may be indirectly set by the final bias setting $S_{BIAS}$ through current-to-voltage conversion. For another example, when the final bias setting $S_{BIAS}$ is a bias voltage setting, the bias setting $V_B$ or ($V_{B1}$, $V_{B2}$) may be directly set by the final bias setting $S_{BIAS}$. However, these are for illustrative purposes only, and are not meant to be limitations of the present invention.

As shown in FIG. 8, the hybrid amplitude calibration circuit 800 includes a continuous-time amplitude calibration circuit 802 and a discrete-time amplitude calibration circuit 804. The continuous-time amplitude calibration circuit 802 includes an amplitude rectifier 812 and a bias feedback circuit 814. The discrete-time amplitude calibration circuit 804 includes a comparator 822, a digital finite state machine (FSM) 824, a bias adjusting circuit 826, and a storage device 828. The hybrid amplitude calibration circuit 800 operates in difference phases sequentially to determine and output the final bias setting $S_{BIAS}$ to the reconfigurable oscillator amplifier 110. For better understanding of technical features of the hybrid amplitude calibration circuit 800, several switches SW1', SW2', SW3', SW4' may be used to illustrate the switching of different phases of the hybrid amplitude calibration circuit 800. However, using switches SW1'-SW4' to control the switching of different phases of the hybrid amplitude calibration circuit 800 is for illustrative purposes only, and is not meant to be a limitation of the present invention. Alternatively, each circuit block in the hybrid amplitude calibration circuit 800 may be selectively enabled or disabled in different phases of the hybrid amplitude calibration circuit 800.

Figure 9:
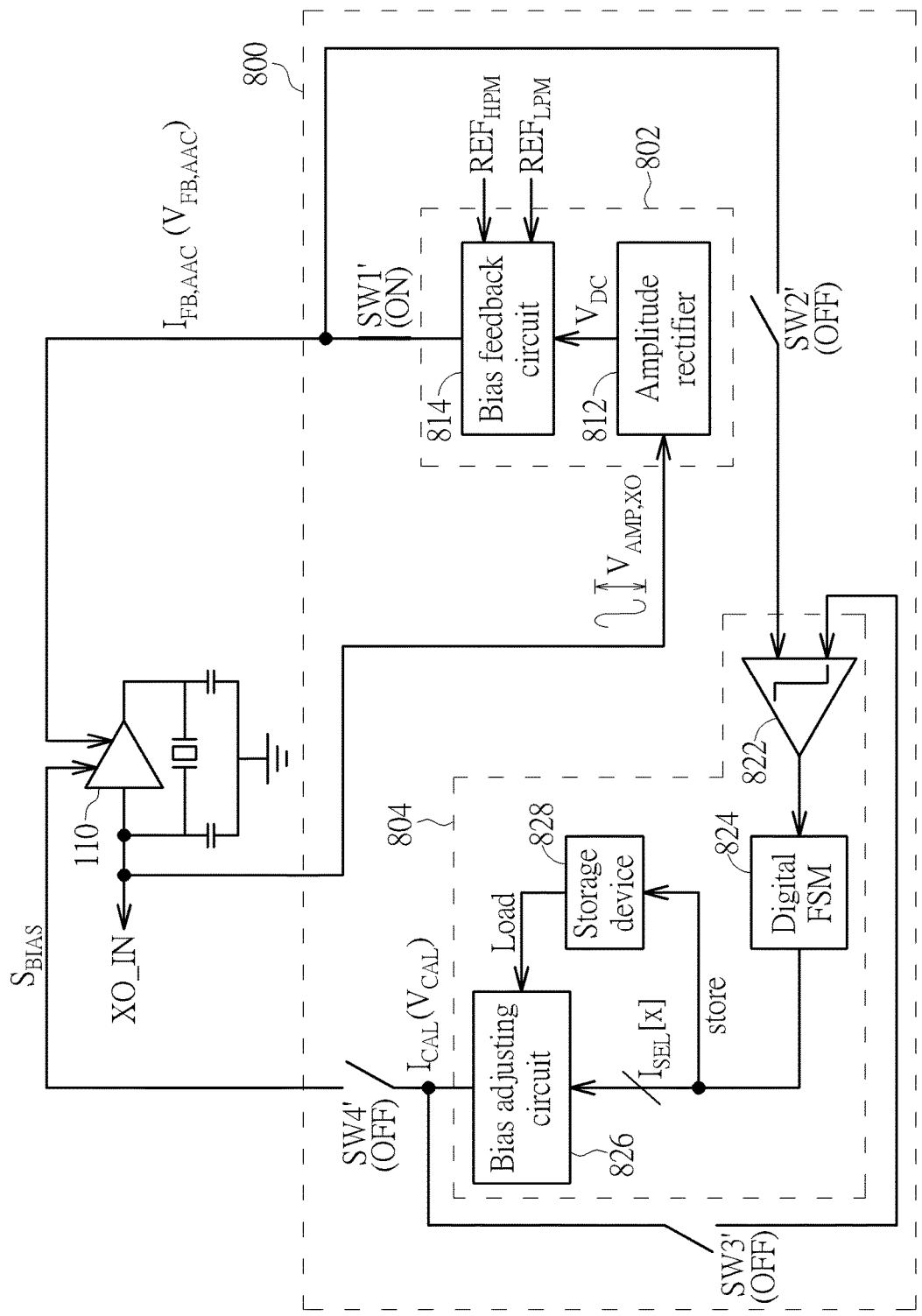
FIG. 9 is a diagram illustrating the hybrid amplitude calibration circuit in a first phase according to an embodiment of the present invention.

When the hybrid amplitude calibration is enabled due to a mode transition, a first phase of the hybrid amplitude calibration is started. During the first phase of the hybrid amplitude calibration, the switch SW1' is switched on and the switches SW2', SW3' and SW4' are switched off, as illustrated in FIG. 9. The continuous-time amplitude calibration circuit 802 is enabled to perform the continuous-time amplitude calibration upon the oscillation signal XO_IN to determine a first bias setting $I_{FB,AAC}$ (or $V_{FB,AAC}$) of the reconfigurable oscillator amplifier 110. The amplitude rectifier 812 translates amplitude $V_{AMP,XO}$ of the oscillation signal XO_IN into a direct current (DC) voltage level $V_{DC}$. Next, the bias feedback circuit 814 compares the DC voltage level $V_{DC}$ with a reference amplitude level to adaptively and continuously adjust the first bias setting $I_{FB,AAC}$ (or $V_{FB,AAC}$). As mentioned above, the hybrid amplitude calibration is performed during a mode transition from a first operation to a second operation mode (e.g., low power mode or high performance mode). In a case where the second operation mode is the low power mode, a reference amplitude level $REF_{LPM}$ for the low power mode is used by the bias feedback circuit 814. In another case where the second operation mode is the high performance mode, a reference amplitude level $REF_{HPM}$ for the high performance mode is used by the bias feedback circuit 814. The amplitude of the oscillation signal XO_IN is affected by the first bias setting $I_{FB,AAC}$ (or $V_{FB,AAC}$) applied to the reconfigurable oscillator amplifier 110. Since a closed-loop calibration is performed by the continuous-time amplitude calibration circuit 802, the first bias setting $I_{FB,AAC}$ (or $V_{FB,AAC}$) will be converged/settled when the DC voltage level $V_{DC}$ is substantially equal to the reference amplitude level (e.g., $REF_{LPM}$ or $REF_{HPM}$).

Figure 10:
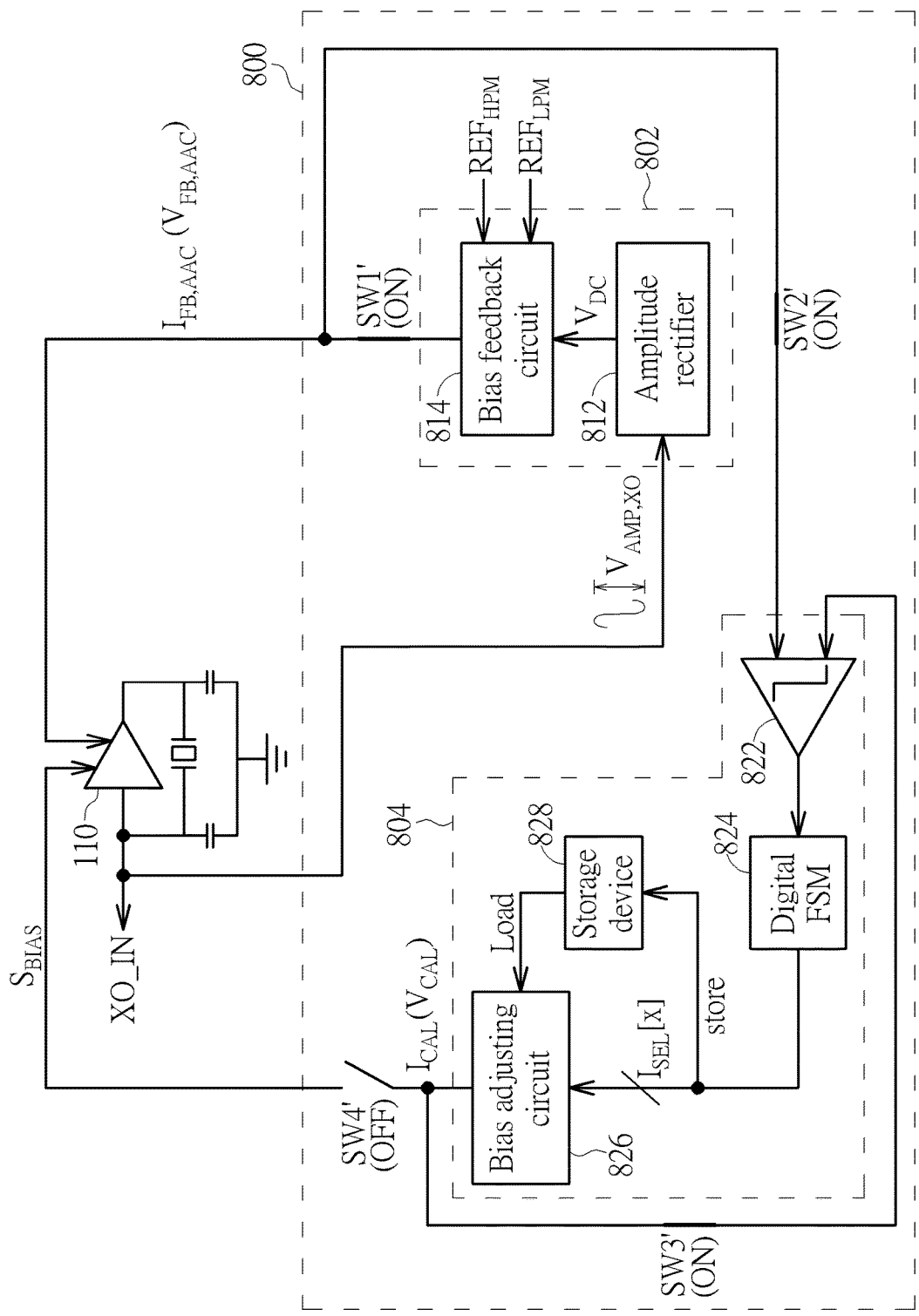
FIG. 10 is a diagram illustrating the hybrid amplitude calibration circuit in a second phase according to an embodiment of the present invention.

When the first bias setting $I_{FB,AAC}$ (or $V_{FB,AAC}$) is converged/settled, the first phase of the hybrid amplitude calibration is ended, and a second phase of the hybrid amplitude calibration is started. During the second phase of the hybrid amplitude calibration, the switches SW1', SW2' and SW3' are switched on, and the SW4' is switched off, as illustrated in FIG. 10. The discrete-time amplitude calibration circuit 804 is enabled to perform the discrete-time amplitude calibration upon a second bias setting $I_{CAL}$ (or $V_{CAL}$) by comparing the second bias setting $I_{CAL}$ (or $V_{CAL}$) with the first bias setting $I_{FB,AAC}$ (or $V_{FB,AAC}$). The comparator 822 receives the first bias setting $I_{FB,AAC}$ (or $V_{FB,AAC}$) settled by the continuous-time amplitude calibration circuit 802, and compares the first bias setting $I_{FB,AAC}$ (or $V_{FB,AAC}$) with the second bias setting $I_{CAL}$ (or $V_{CAL}$) to generate one comparison result to the digital FSM 824. The digital FSM 824 may employ a successive approximation algorithm (i.e., digital binary search algorithm) to determine each bit [x] of a digital control word $I_{SEL}$. For example, the digital FSM 824 initially sets the most significant bit (MSB) of the digital control word $I_{SEL}$ by 1 and the remaining bits of the digital control word $I_{SEL}$ by 0's, and the second bias setting $I_{CAL}$ (or $V_{CAL}$) is generated to the comparator 822. Hence, the first comparison result is used by the digital FSM 824 to confirm the MSB of the digital control word $I_{SEL}$. Next, the digital FSM 824 updates the second MSB of the digital control word $I_{SEL}$ by 1, and the updated second bias setting $I_{CAL}$ (or $V_{CAL}$) is generated to the comparator 822. Hence, the second comparison result is used by the digital FSM 824 to confirm the second MSB of the digital control word $I_{SEL}$. Supposing that the digital control word $I_{SEL}$ has N bits, bits of the digital control word $I_{SEL}$ are successively determined after N comparison results are successively generated by the comparator 822. Due inherent characteristics of the successive approximation algorithm, the second bias setting $I_{CAL}$ (or $V_{CAL}$) finally found by the discrete-time amplitude calibration is close to or identical to the first bias setting $I_{FB,AAC}$ (or $V_{FB,AAC}$). It should be noted that the second bias setting $I_{CAL}$ (or $V_{CAL}$) determined during the second phase of the hybrid amplitude calibration is not output to the reconfigurable oscillator amplifier 110.

Figure 11:
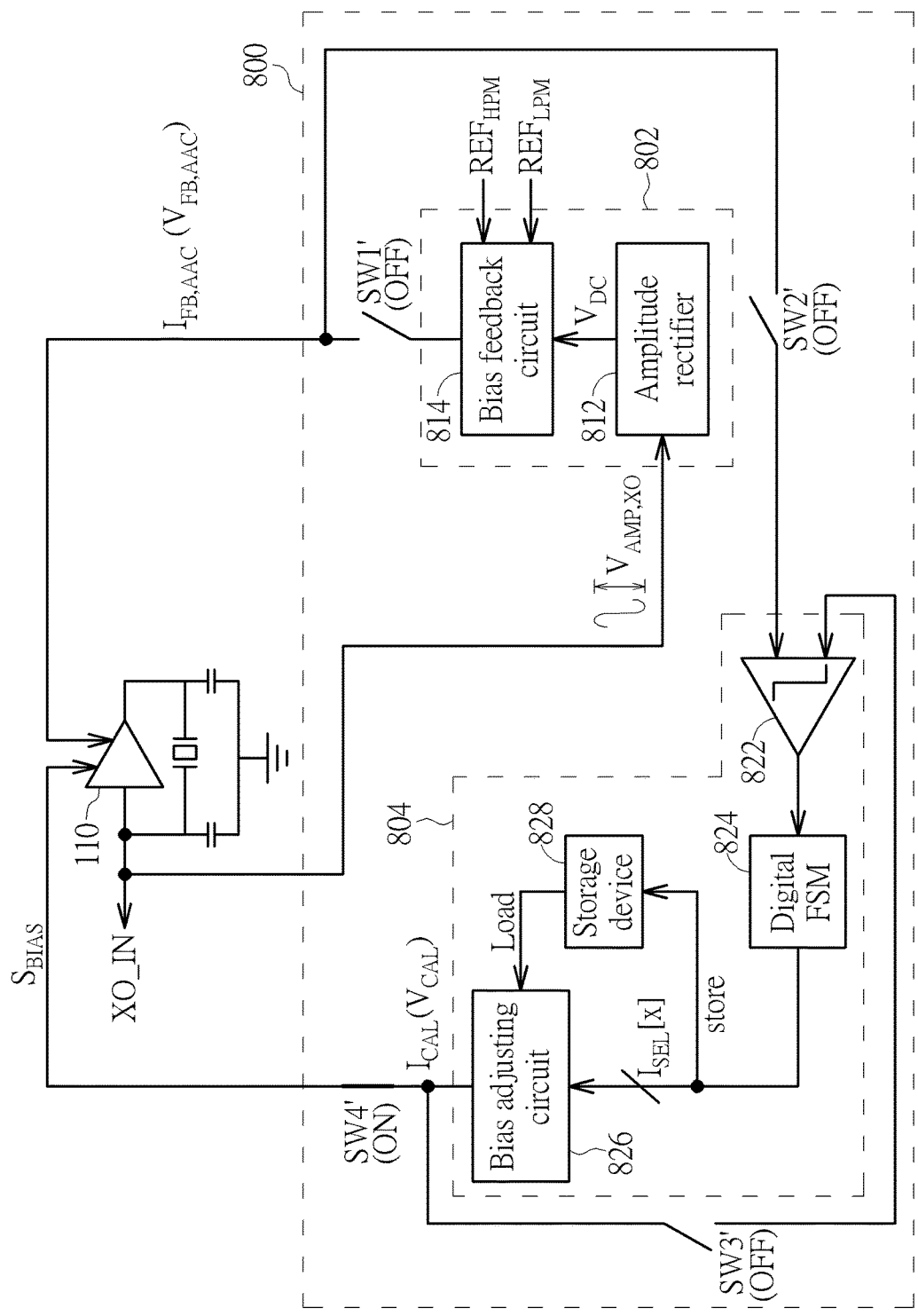
FIG. 11 is a diagram illustrating the hybrid amplitude calibration circuit in a third phase according to an embodiment of the present invention.

When the second bias setting $I_{CAL}$ (or $V_{CAL}$) is finally determined (i.e., all bits of the digital control word $I_{SEL}$ are determined), the second phase of the hybrid amplitude calibration is ended, and a third phase of the hybrid amplitude calibration is started. During the third phase of the hybrid amplitude calibration, the switches SW1', SW2' and SW3' are switched off, and the switch SW4' is switched on, as illustrated in FIG. 11. At this moment, the second bias setting $I_{CAL}$ (or $V_{CAL}$) is output as the final bias setting $S_{BIAS}$ for the second operation mode (e.g., low power mode or high performance mode), while no first bias setting $I_{FB,AAC}$ (or $V_{FB,AAC}$) is supplied to the reconfigurable oscillator amplifier 110. In other words, when the reconfigurable oscillator amplifier 110 is operated in the second operation mode, the final bias setting $S_{BIAS}$ is supplied from the bias adjusting circuit 826 rather than the bias feedback circuit 814. In this embodiment, a bias setting of the reconfigurable oscillator amplifier 110 is seamlessly changed from the first bias setting $I_{FB,AAC}$ (or $V_{FB,AAC}$) to the second bias setting $I_{CAL}$ (or $V_{CAL}$).

Compared to discrete-time amplitude calibration which performs calibration based on the oscillator output and requires multiple times of oscillator settling, the continuous-time amplitude calibration has shorter settling time for the first bias setting $I_{FB,AAC}$ (or $V_{FB,AAC}$). Since the second bias setting $I_{CAL}$ (or $V_{CAL}$) is calibrated based on the first bias setting $I_{FB,AAC}$ (or $V_{FB,AAC}$), the calibration of the final bias setting $S_{BIAS}$ can gain the benefit (e.g., short settling time) from the continuous-time amplitude calibration.

In addition, compared to the continuous-time amplitude calibration circuit 802 suffering from noise and power consumption to keep the closed loop, the discrete-time amplitude calibration circuit 804 can be properly designed to provide the second bias setting $I_{CAL}$ (or $V_{CAL}$) with lower power consumption and better noise performance. Hence, the calibration of the final bias setting $S_{BIAS}$ can also gain the benefits (e.g., low power and low noise) from the proposed discrete-time amplitude calibration. It should be noted that, compared to using discrete-time amplitude calibration to calibrate the second bias setting $I_{CAL}$ (or $V_{CAL}$) based on the oscillation signal XO_IN, using discrete-time amplitude calibration to calibrate the second bias setting $I_{CAL}$ (or $V_{CAL}$) based on the first bias setting $I_{FB,AAC}$ (or $V_{FB,AAC}$) can be done in a short time. Hence, compared to using the continuous-time amplitude calibration circuit 802 only, using the hybrid amplitude calibration circuit 800 benefits from the continuous-time amplitude calibration circuit 802 and the discrete-time amplitude calibration circuit 804, without significantly increasing the overall calibration time. In summary, the hybrid amplitude calibration circuit 800 can achieve short calibration time by using the continuous-time amplitude calibration circuit 802 and can achieve low power and low noise by using the discrete-time amplitude calibration circuit 804.

Since the discrete-time amplitude calibration circuit 804 employs a digital calibration means, a digital control word $I_{SEL}$ finally found for each particular operation mode (e.g., low power mode or high performance mode) can be stored in the storage device 828 such as a non-volatile memory. When the reconfigurable oscillator amplifier 110 is required to enter the second operation mode (e.g., low power mode or high performance mode) again, the hybrid amplitude calibration circuit 800 may directly load the required digital control code $I_{SEL}$ from the storage device 828 and directly set the final bias setting $S_{BIAS}$ according to the loaded digital control code $I_{SEL}$, without performing the continuous-time amplitude calibration and the discrete-time amplitude calibration.

When the reconfigurable oscillator amplifier 110 is operated in the start-up mode, the amplitude rectifier 812 may be used to provide the DC voltage level $V_{DC}$ referenced to judge an end of the start-up process. For example, the DC voltage level $V_{DC}$ is monitored to determine if the amplitude of the oscillation signal XO_IN reaches an end-of-startup target level. When it is determined that the amplitude of the oscillation signal XO_IN reaches the end-of-startup target level, the start-up process is ended and a mode transition from a current operation (i.e., start-up mode) to a next operation mode (e.g., high performance mode or low power mode) is initiated.

In the above embodiment shown in FIG. 1, the oscillator circuit 108 is configured to include the reconfigurable oscillator amplifier 110 (e.g., proposed reconfigurable oscillator amplifier 400 shown in FIG. 4) and the hybrid amplitude calibration circuit 112 (e.g., proposed hybrid amplitude calibration circuit 800 shown in FIG. 8). However, this is for illustrative purposes only, and is not meant to be a limitation of the present invention. Any oscillator circuit using one of the reconfigurable oscillator amplifier 110 (e.g., proposed reconfigurable oscillator amplifier 400 shown in FIG. 4) and the hybrid amplitude calibration circuit 112 (e.g., proposed hybrid amplitude calibration circuit 800 shown in FIG. 8) falls within the scope of the present invention. For example, the oscillator circuit 108 may be modified to include the reconfigurable oscillator amplifier 110 (e.g., proposed reconfigurable oscillator amplifier 400 shown in FIG. 4) and an amplitude calibration circuit using a different amplitude calibration design. For another example, the oscillator circuit 108 may be modified to include the hybrid amplitude calibration circuit 112 (e.g., proposed hybrid amplitude calibration circuit 800 shown in FIG. 8) and an oscillator amplifier with a different amplifier design.

Those skilled in the art will readily observe that numerous modifications and alterations of the device and method may be made while sustaining the teachings of the invention. Accordingly, the above disclosure should be construed as limited only by the metes and bounds of the appended claims.

What is claimed is:

1. An oscillator circuit comprising:
a reconfigurable oscillator amplifier, configured to be coupled to a resonant circuit in parallel;
wherein the reconfigurable oscillator amplifier supports different circuit configurations for different operation modes, respectively; the reconfigurable oscillator amplifier comprises at least one circuit component shared by the different circuit configurations; and the reconfigurable oscillator amplifier is configured to employ one of the different circuit configurations under one of the different operation modes;
wherein the different operation modes comprise a first operation mode and a second operation mode; and the reconfigurable oscillator amplifier comprises:
a first transistor, having a first connection node coupled to a first reference voltage, a control node, and a second connection node;
a second transistor, having a first connection node coupled to the second connection node of the first transistor, a control node, and a second connection node;
a third transistor, having a first connection node coupled to the second connection node of the second transistor, a control node, and a second connection node, wherein the control node and the first connection node of the third transistor are configured to be connected to the resonant circuit; and
a first switch, coupled between the first reference voltage and the second connection node of the first transistor;
wherein when the reconfigurable oscillator amplifier is operated in the first operation mode, the first switch is switched on; and when the reconfigurable oscillator amplifier is operated in the second operation mode, the first switch is switched off.

2. The oscillator circuit of claim 1, wherein the reconfigurable oscillator amplifier further comprises:
a reconfigurable resistor-capacitor (RC) circuit, comprising:
a capacitor;
a resistor, coupled to the capacitor in series;
a second switch, coupled to the resistor in parallel;
wherein when the reconfigurable oscillator amplifier is operated in the first operation mode, the RC circuit is coupled between the second connection node of the first transistor and a second reference voltage with the second switch switched off; and when the reconfigurable oscillator amplifier is operated in the second operation mode, the RC circuit is coupled between the second connection node of the first transistor and the second reference voltage with the second switch switched on.

3. The oscillator circuit of claim 1, wherein the reconfigurable oscillator amplifier further comprises:
a second switch, having a first end and a second end, wherein the first end is coupled to the second connection node of the first transistor; and
a resistor-capacitor (RC) circuit, coupled between the second end of the second switch and a second reference voltage, wherein the RC circuit comprises:
a capacitor; and
a resistor, coupled to the capacitor in series;
wherein when the reconfigurable oscillator amplifier is operated in the first operation mode, the second switch is switched on; and when the reconfigurable oscillator amplifier is operated in the second operation mode, the second switch is switched off.

4. The oscillator circuit of claim 1, wherein the reconfigurable oscillator amplifier further comprises:
a source degeneration circuit, coupled between the second connection node of the third transistor and a second reference voltage; and
a second switch, coupled to the source degeneration circuit in parallel;
wherein when the reconfigurable oscillator amplifier is operated in the first operation mode, the second switch is switched on; and when the reconfigurable oscillator amplifier is operated in the second operation mode, the second switch is switched off.

5. An oscillator circuit comprising:
a reconfigurable oscillator amplifier, configured to be coupled to a resonant circuit in parallel;
wherein the reconfigurable oscillator amplifier supports different circuit configurations for different operation modes, respectively; the reconfigurable oscillator amplifier comprises at least one circuit component shared by the different circuit configurations; and the reconfigurable oscillator amplifier is configured to employ one of the different circuit configurations under one of the different operation modes;
wherein the different operation modes comprise a first operation mode and a second operation mode, and the reconfigurable oscillator amplifier comprises:
a first transistor, having a first connection node coupled to a first reference voltage, a control node, and a second connection node; and
a second transistor, having a first connection node coupled to the second connection node of the first transistor, a control node, and a second connection node; and
a reconfigurable resistor-capacitor (RC) circuit, comprising:
a capacitor;
a resistor, coupled to the capacitor in series; and
a switch, coupled to the resistor in parallel;
wherein when the reconfigurable oscillator amplifier is operated in the first operation mode, the control node and the second connection node of the second transistor are configured to be connected to the resonant circuit, and the RC circuit is coupled between the second connection node of the first transistor and a second reference voltage with the second switch switched off; and when the oscillator circuit is operated in the second operation mode, the control node and the second connection node of the second transistor are configured to be connected to the resonant circuit, and the RC circuit is coupled between the second connection node of the first transistor and the second reference voltage with the second switch switched on.

6. An oscillator circuit comprising:
a reconfigurable oscillator amplifier, configured to be coupled to a resonant circuit in parallel;
wherein the reconfigurable oscillator amplifier supports different circuit configurations for different operation modes, respectively; the reconfigurable oscillator amplifier comprises at least one circuit component shared by the different circuit configurations; and the reconfigurable oscillator amplifier is configured to employ one of the different circuit configurations under one of the different operation modes;

wherein the different operation modes comprise a first operation mode and a second operation mode, and the reconfigurable oscillator amplifier comprises:
a first transistor, having a first connection node coupled to a first reference voltage, a control node, and a second connection node;
a second transistor, having a first connection node coupled to the second connection node of the first transistor, a control node, and a second connection node;
a switch, having a first end and a second end, wherein the first end is coupled to the second connection node of the first transistor; and
a resistor-capacitor (RC) circuit, coupled between the second end of the switch and a second reference voltage, wherein the RC circuit comprises:
a capacitor; and
a resistor, coupled to the capacitor in series;
wherein when the reconfigurable oscillator amplifier is operated in the first operation mode, the control node and the second connection node of the second transistor are configured to be connected to the resonant circuit, and the second switch is switched on; and when the reconfigurable oscillator amplifier is operated in the second operation mode, the control node of the second transistor is configured to receive a bias voltage, the second connection node of the second transistor is configured to be connected to the resonant circuit, and the switch is switched off.

7. An oscillator circuit comprising:
a reconfigurable oscillator amplifier, configured to be coupled to a resonant circuit in parallel;
wherein the reconfigurable oscillator amplifier supports different circuit configurations for different operation modes, respectively; the reconfigurable oscillator amplifier comprises at least one circuit component shared by the different circuit configurations; and the reconfigurable oscillator amplifier is configured to employ one of the different circuit configurations under one of the different operation modes;
wherein the different operation modes comprise a first operation mode and a second operation mode, and the reconfigurable oscillator amplifier comprises:
a first transistor, having a first connection node coupled to a first reference voltage, a control node, and a second connection node;
a second transistor, having a first connection node coupled to the second connection node of the first transistor, a control node, and a second connection node;
a switch, having a first end and a second end, wherein the first end is coupled to the second connection node of the first transistor; and
a capacitor, coupled to the second end of the switch;
wherein when the reconfigurable oscillator amplifier is operated in the first operation mode, the control node and the second connection node of the second transistor are configured to be connected to the resonant circuit, the switch is switched on, and the capacitor is coupled between the second connection node of the first transistor and a second reference voltage; and when the reconfigurable oscillator amplifier is operated in the second operation mode, the control node of the second transistor is configured to receive a bias voltage, the second connection node of the second transistor is configured to be connected to the resonant circuit, and the switch is switched off.

8. An oscillator circuit comprising:
a reconfigurable oscillator amplifier, configured to be coupled to a resonant circuit in parallel;
wherein the reconfigurable oscillator amplifier supports different circuit configurations for different operation modes, respectively; the reconfigurable oscillator amplifier comprises at least one circuit component shared by the different circuit configurations; and the reconfigurable oscillator amplifier is configured to employ one of the different circuit configurations under one of the different operation modes;
wherein the different operation modes comprise a first operation mode and a second operation mode, and the reconfigurable oscillator amplifier comprises:
a first transistor, having a first connection node, a control node, and a second connection node;
a second transistor, having a first connection node coupled to the second connection node of the first transistor, a control node, and a second connection node, wherein the control node and the first connection node of the second transistor are configured to be coupled to the resonant circuit; and
a switch, coupled between the control node of the first transistor and the control node of the second transistor;
wherein when the reconfigurable oscillator amplifier is operated in the first operation mode, the switch is switched on; and when the reconfigurable oscillator amplifier is operated in the second operation mode, the control node of the first transistor is configured to receive a bias voltage, and the switch is switched off.

9. An oscillator circuit comprising:
a reconfigurable oscillator amplifier, configured to be coupled to a resonant circuit in parallel;
wherein the reconfigurable oscillator amplifier supports different circuit configurations for different operation modes, respectively; the reconfigurable oscillator amplifier comprises at least one circuit component shared by the different circuit configurations; and the reconfigurable oscillator amplifier is configured to employ one of the different circuit configurations under one of the different operation modes;
wherein the different operation modes comprise a first operation mode and a second operation mode, and the reconfigurable oscillator amplifier comprises:
a transistor, having a first connection node, a control node, and a second connection node, wherein the control node and the first connection node are configured to be connected to the resonant circuit;
a source degeneration circuit, coupled between the second connection node of the transistor and a reference voltage; and
a switch, coupled to the source degeneration circuit in parallel;
wherein when the reconfigurable oscillator amplifier is operated in the first operation mode, the switch is switched on; and when the reconfigurable oscillator amplifier is operated in the second operation mode, the switch is switched off.

10. An oscillator circuit comprising:
a reconfigurable oscillator amplifier, configured to be coupled to a resonant circuit in parallel, wherein the reconfigurable oscillator amplifier supports different circuit configurations for different operation modes, respectively; the reconfigurable oscillator amplifier comprises at least one circuit component shared by the different circuit configurations; the reconfigurable oscillator amplifier is configured to employ one of the different circuit configurations under one of the different operation modes; and the different operation modes comprise a first operation mode and a second operation mode; and a hybrid amplitude calibration circuit, configured to perform amplitude calibration upon an oscillation signal generated from the resonant circuit to determine a final bias setting of the reconfigurable oscillator amplifier during a mode transition from the first operation mode to the second operation mode, wherein the hybrid amplitude calibration circuit determines the final bias setting by jointly using different amplitude calibration schemes;

wherein the reconfigurable oscillator amplifier and the hybrid amplitude calibration circuit are separate circuits.

11. The oscillator circuit of claim 10, wherein the different amplitude calibration schemes comprise continuous-time amplitude calibration and discrete-time amplitude calibration, and the hybrid amplitude calibration circuit comprises:

a first amplitude calibration circuit, configured to perform the continuous-time amplitude calibration upon the oscillation signal to determine a first bias setting of the reconfigurable oscillator amplifier; and a second amplitude calibration circuit, configured to perform the discrete-time amplitude calibration upon a second bias setting by comparing the second bias setting with the first bias setting, and output the second bias setting as the final bias setting.

12. The oscillator circuit of claim 11, wherein the second amplitude calibration circuit determines a digital control code by the discrete-time amplitude calibration, and sets the final bias setting according to the digital control code; the second amplitude calibration circuit is further configured to store the digital control code in a storage device; and when the reconfigurable oscillator amplifier is required to enter the second operation mode again, the hybrid amplitude calibration circuit is further configured to load the digital control code from the storage device and set the final bias setting according to the loaded digital control code, without performing the continuous-time amplitude calibration and the discrete-time amplitude calibration.

13. The oscillator circuit of claim 11, wherein the first amplitude calibration circuit does not output the first bias setting to the reconfigurable oscillator amplifier when the second amplitude calibration circuit outputs the second bias setting as the final bias setting.

14. The oscillator circuit of claim 11, wherein the second amplitude calibration circuit does not output the second bias setting as the final bias setting during the discrete-time amplitude calibration.

15. An oscillator circuit comprising:

an oscillator amplifier, configured to be coupled to a resonant circuit in parallel; and a hybrid amplitude calibration circuit, configured to perform amplitude calibration upon an oscillation signal generated from the resonant circuit to determine a final bias setting of the oscillator amplifier during a mode transition from a first operation mode of the oscillator amplifier to a second operation mode of the oscillator amplifier, wherein the hybrid amplitude calibration circuit determines the final bias setting by using different amplitude calibration schemes;

wherein the different amplitude calibration schemes comprise continuous-time amplitude calibration and discrete-time amplitude calibration, and the hybrid amplitude calibration circuit comprises:

a first amplitude calibration circuit, configured to perform the continuous-time amplitude calibration upon the oscillation signal to determine a first bias setting of the oscillator amplifier; and a second amplitude calibration circuit, configured to perform the discrete-time amplitude calibration upon a second bias setting by comparing the second bias setting with the first bias setting, and output the second bias setting as the final bias setting.

16. The oscillator circuit of claim 15, wherein the first amplitude calibration circuit does not output the first bias setting to the oscillator amplifier when the second amplitude calibration circuit outputs the second bias setting as the final bias setting.

17. The oscillator circuit of claim 15, wherein the second amplitude calibration circuit does not output the second bias setting as the final bias setting during the discrete-time amplitude calibration.

* * * * *